US012620999B2

(12) United States Patent
Ollivry et al.

(10) Patent No.: US 12,620,999 B2
(45) Date of Patent: May 5, 2026

(54) CONVERSION START-UP OF AN ANALOG-TO-DIGITAL CONVERTER WITHIN AN INTEGRATED CIRCUIT

(71) Applicant: STMicroelectronics International N.V., Geneva (CH)

(72) Inventors: Sandrine Ollivry, St Maxim la St Baume (FR); Jean-Francois Link, Trets (FR)

(73) Assignee: STMicroelectronics International N.V., Geneva (CH)

( * ) Notice: Subject to any disclaimer, the term of this patent is extended or adjusted under 35 U.S.C. 154(b) by 189 days.

(21) Appl. No.: 18/742,445

(22) Filed: Jun. 13, 2024

(65) Prior Publication Data

US 2024/0429935 A1 Dec. 26, 2024

(30) Foreign Application Priority Data

Jun. 23, 2023 (FR) ...................................... 2306551

(51) Int. Cl.
H03M 1/12 (2006.01)

(52) U.S. Cl.
CPC ................................. H03M 1/1255 (2013.01)

(58) Field of Classification Search
CPC .. H03M 1/1245; H03M 1/001; H03M 1/0624; H03M 1/002
USPC ................................................. 341/126, 155
See application file for complete search history.

(56) References Cited

U.S. PATENT DOCUMENTS

| | | | |
|---|---|---|---|
| 5,182,561 A | 1/1993 | Sasaki | |
| 5,430,660 A | 7/1995 | Lueker et al. | |
| 8,513,989 B1* | 8/2013 | Martin | H03L 7/00 327/146 |
| 11,968,288 B2* | 4/2024 | Mathe | H04W 56/005 |
| 11,996,857 B2* | 5/2024 | Lee | H03M 1/1014 |

FOREIGN PATENT DOCUMENTS

GB        2070827 A        2/1980

OTHER PUBLICATIONS

Wlodarczyk, Przemyslaw et al., "Multi-channel data acquisition system with absolute time sychronization", Nuclear Instruments and Methods in Physics Research A, 763, Jun. 9, 2014, pp. 150-154.

* cited by examiner

*Primary Examiner* — Peguy Jean Pierre
(74) *Attorney, Agent, or Firm* — Slater Matsil, LLP

(57) ABSTRACT

An analog-to-digital converter is clocked by a converter clock signal. A first clock signal has a frequency multiple of the frequency of the converter clock signal. A timer, which is clocked with the rhythm of the first clock signal, has a timing period multiple of the period of the converter clock signal. A processor is configured to control the converter based on the timing signal delivered by the timer, and has a first operating mode in which it is further configured to clock the timer synchronously with the converter clock signal and to deliver based on the timing signal, a periodic first conversion control signal of the converter, having a period multiple of the period of the converter clock signal and a constant first phase difference with the converter clock signal.

20 Claims, 8 Drawing Sheets

FIG. 2

CONVERSION START-UP OF AN ANALOG-TO-DIGITAL CONVERTER WITHIN AN INTEGRATED CIRCUIT

CROSS-REFERENCE TO RELATED APPLICATIONS

This application claims the benefit of French Patent Application No. 2306551, filed on Jun. 23, 2023, which application is hereby incorporated herein by reference.

TECHNICAL FIELD

Embodiments relate to integrated circuits, in particular microcontrollers, for example those embedding one or more analog-to-digital converters as well as a timer, and associated methods, and more particularly to management of the start-up of the conversion periods of the converter(s).

BACKGROUND

Some current microcontrollers offer a so-called "fixed trigger latency" feature, i.e., a fixed duration or latency between the time of commanding or triggering an analog-to-digital conversion and the time when this conversion actually starts.

Such a feature is useful in particular in motor control or audio processing applications.

The timer then drives the application based on a pulse-width modulated signal ("PWM: Pulse Width Modulation").

Analog-to-digital conversions are regularly controlled at each period of the PWM signal and for some applications it is essential that the aforementioned latency does not change from one period to another, i.e., that there is no jitter.

This is ensured by construction when the converter and the timer are respectively clocked by synchronous clocks.

It is possible to obtain a fixed latency when the converter and the timer are respectively clocked by pseudo-synchronous clocks with low frequency ratios (2 or 4) but at the expense of an alteration of the performances of the converter.

Yet, the maximum clock frequency of an analog-to-digital converter is currently in the range of 75 MHz whereas that of a timer could range up to several hundred MHz.

Therefore, the triggering signal of a conversion, emitted by the timer, could occur at any time over the period of the clock signal clocking the converter.

Consequently, the latency between the triggering time point and the actual conversion start time point could change.

Hence, there is a need to offer a fixed latency between the time point of triggering and the time point of actual starting of the conversion, even for high frequency ratios between the clock frequency of the timer and the clock frequency of the converter, and that being so without alteration of the performances of the converter.

SUMMARY

According to one aspect, an integrated circuit, for example a microcontroller, is provided, comprising:

at least one first analog-to-digital converter which can be clocked by a converter clock signal a clock input for receiving a first clock signal having a frequency multiple of the frequency of the converter clock signal, a timer, which can be clocked with the rhythm of the first clock signal and having a timing period multiple of the period of the converter clock signal, and a processor configured to control the at least one first converter based on the timing signal delivered by the timer.

The processor has a first operating mode in which it is further configured to clock the timer synchronously with the converter clock signal and to deliver based on the timing signal delivered by the timer, a periodic first conversion control signal of the converter, having a period multiple of the period of the converter clock signal and a constant first phase difference with the converter clock signal.

Hence, a fixed (constant) and predictable latency is obtained between the triggering time point and the actual conversion start time point, even for high frequency ratios between the clock frequency of the timer and the clock frequency of the converter.

According to one embodiment, the integrated circuit further comprises a control input for receiving a conversion control external signal, for example a bit.

In the first operating mode, in response to the conversion control external signal, the processor is configured to:

generate an edge, for example a rising edge, of the periodic first conversion control signal, each time the timer reaches a selected timing value, for example yet not necessarily the value corresponding to the value of the timing period.

The first converter is configured to periodically begin conversions after a fixed and constant first duration after the edge of the periodic first conversion control signal.

This fixed duration may be equal to an integer number of periods of the converter clock signal. It may also be equal to a period fraction of the converter clock signal or be equal to x cycles or periods of the first clock signal increased by y cycles or periods of the converter clock signal.

Advantageously, the processor is further configured to deliver the converter clock signal as well as a sync signal indicating a first time point, for example yet not necessarily the beginning, of each period of the converter clock signal, the first time point being identical for each period, and, in the presence of the conversion control external signal, to delay triggering of the timer until the next first time point, for example the beginning of the next period of the converter clock signal.

According to one embodiment, the processor is configured to select the timing value from among several predefined timing values.

In the first operating mode, the timer can advantageously be reset synchronously with the converter clock signal.

According to one embodiment, the integrated circuit may comprise at least one second analog-to-digital converter, and possibly more than two converters, which can be clocked by the converter clock signal and the processor is configured, in a first configuration, to deliver periodic second conversion control signal having a period multiple of the period of the converter clock signal and a constant second phase difference with the converter clock signal.

Thus, the same clock signals clocks all converters.

This is particularly advantageous since aligning the clocks of all converters allows reducing disturbances on the common reference, for example a common referenced voltage, of the converters.

Indeed, the Inventors have observed that when several converters present on the same integrated circuit operate asynchronously with each other, they disturb each other by injecting noise in the reference.

And that delivering the same clock signal to all converters, allows predicting the time point when each converter injects noise and consequently controlling this disturbance in order to reduce it, which has not been possible in the solutions of the prior art.

Moreover, the constant phase differences (constant latency) associated with the different converters may be identical or different for at least some of them.

Advantageously, the processor may have a second operating mode in which it is configured to clock the timer asynchronously with the converter clock signal.

Indeed, in some applications, it might be useful not to have a constant latency.

It is then particularly advantageous that the integrated circuit comprises a selection input for receiving a selection signal, for example a bit, the two operating modes of the processor then being selectable by the selection signal.

BRIEF DESCRIPTION OF THE DRAWINGS

Other advantages and features of the invention will appear upon examining the detailed description of non-limiting implementations and embodiments, and from the appended drawings, wherein:

FIG. 2 illustrates an embodiment processor;

DETAILED DESCRIPTION OF ILLUSTRATIVE EMBODIMENTS

Figure 1:
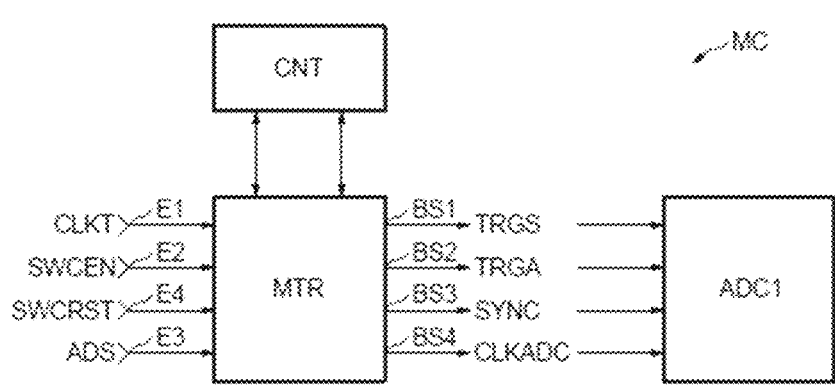
FIG. 1 illustrates an embodiment integrated circuit.

In FIG. 1, the referenced MC refers to an integrated circuit herein forming, for example, a microcontroller.

Quite schematically, and in this simplified embodiment, the microcontroller MC includes processor MTR, which will be reviewed in more details hereinafter on an exemplary structure and operation, cooperating with a timer CNT.

The microcontroller MC herein also includes an analog-to-digital converter ADC1 which can be clocked by a converter clock signal CLKADC.

The microcontroller MC includes a clock input E1 to receive a first clock signal CLKT having for example a frequency comprised between 250 MHz and 400 MHz.

This first clock signal has a frequency multiple of the frequency of the converter clock signal CLKADC which may be comprised for example between 10 MHz and 70 MHz.

The timer CNT can be clocked with the rhythm of the first clock signal CLKT and, as will be seen in more details hereinafter, has a timing period multiple of the period of the converter clock signal CLKADC.

The processor MTR, which cooperates with the timer CNT, is configured to control the converter ADC based on the timing signal delivered by the timer CNT.

As will be seen in more details hereinafter, the processor has a first operating mode in which it is further configured to:

clock the timer CNT synchronously with the converter clock signal CLKADC and to deliver based on the timing signal delivered by the timer, a first conversion control signal TRGS, on a first output terminal BS1, this signal TRGS being intended for the converter ADC1.

As will be seen in more details hereinafter, the processor MTR has a second operating mode in which it is configured to clock the timer CNT asynchronously with the converter clock signal CLKADC.

In this second operating mode, the processor MTR delivers on a second output terminal BS2 a conversion control signal TRGA intended for the converter ADC1.

The processor MTR also delivers on a third output terminal BS3 a logic signal SYNC, for example a bit, intended for the converter ADC1, so that the latter could, depending on the logic value of the bit SYNC, process either the signal TRGS or the signal TRGA.

These two operating modes are selectable by a selection signal ADS, received on a selection input E3.

The microcontroller also includes a control input E2 intended to receive an external signal SWCEN which, as will be seen in more details hereinafter, will actually allow controlling, with some delay, the activation of the timer CNT.

Yet, as will be seen in more details hereinafter, the activation of the timer will allow activating a conversion control of the converter ADC1.

Thus, it is possible to refer to the signal SWCEN as a conversion control external signal.

Finally, another input E4 is intended to receive a reset external signal of the counter CNT, this external signal being referenced SWCRST.

Figure 2:
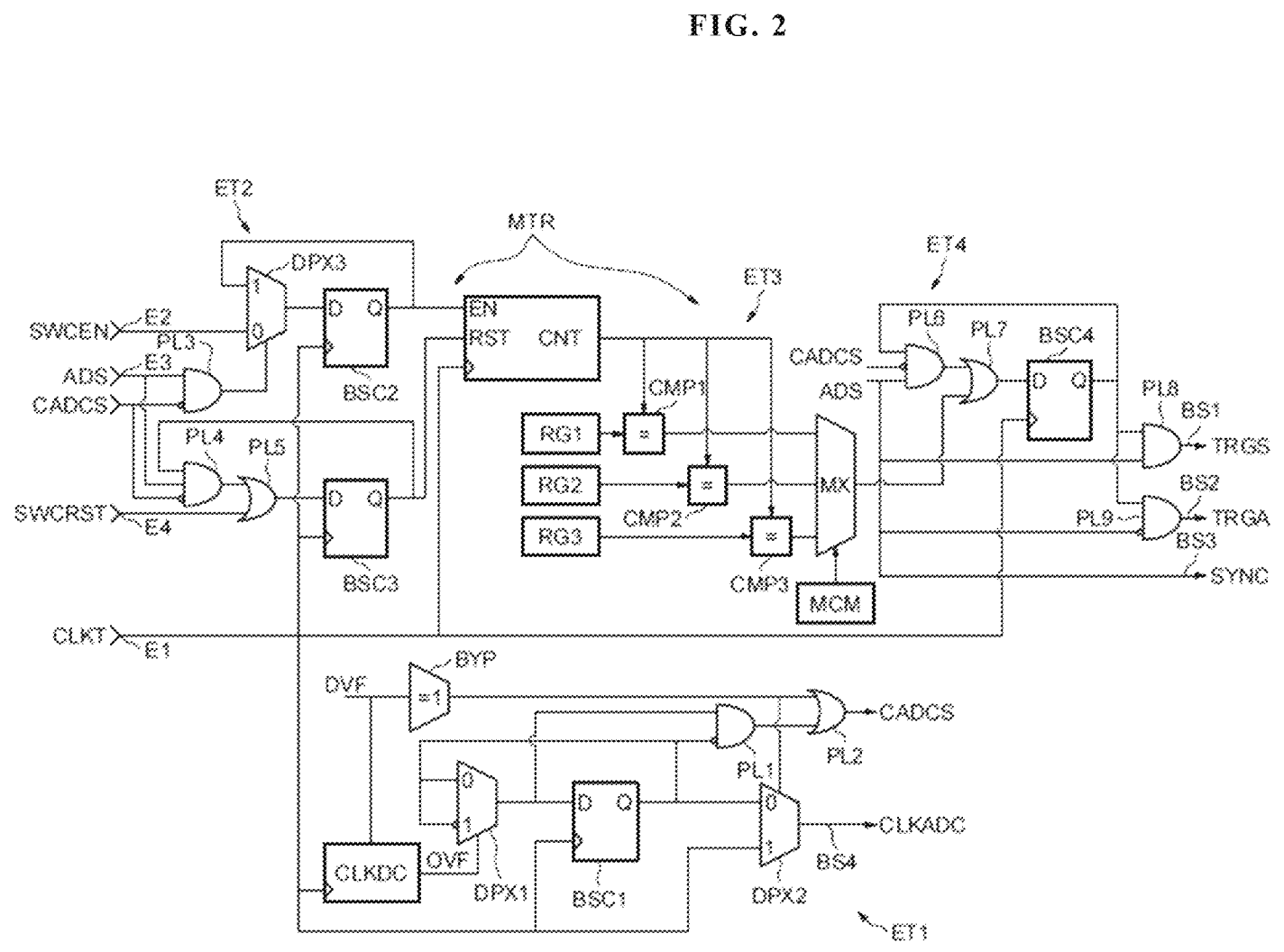

Reference is now made more particularly to FIG. 2 to illustrate an embodiment of the processor MTR, which is herein provided only as a non-limiting example.

The processor MTR includes a first stage ET1 including a divider timer CLKDC clocked by the first clock signal CLKT and receiving a division factor DVF.

This divider counter has an overflow bit ("overflow") which, by its logic value, control the two inputs 0 and 1 of the duplexer DPX1.

The output of the duplexer DPX1 is connected to a first input of an AND logic gate, referenced PL1, whose second input is an inverting input.

The output of the duplexer DPX1 is also connected to the input D of a D-type flip-flop BSC1, clocked by the first clock signal CLKT and whose output Q is connected to the inverting input of the logic gate PL1, to the input 0 of the duplexer DPX1 and, after inversion, to the input 1 of the duplexer DPX1.

The output Q of the flip-flop BSC1 is also connected to the input 0 of a duplexer DPX2 whose input 1 receives the first clock signal CLKT.

The output of the duplexer DPX2 forms the output terminal BS4 which delivers the converter clock signal CLKADC.

The output of the logic gate PL1 is connected to a first input of an OR logic gate referenced PL2 a second input of which receives the division factor DVF in the case where the latter is equal to 1 because of a bypass BYP.

The control input of the duplexer DPX2 and connected to the second input of the gate PL2.

The output of the logic gate PL2 delivers a sync signal CADCS the role of which will now be described more particularly with reference to FIGS. 3 and 4.

Figure 3:
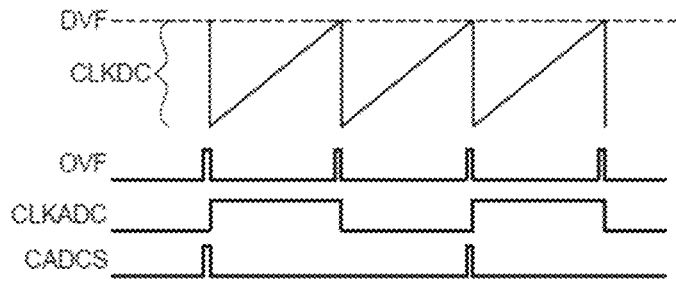
FIG. 3 illustrates a timing diagram for the divider counter and the sync signal herein marking the beginning of a period of the converter clock signal.

In FIG. 3, one could see that the divider counter increases until reaching the value of the division factor DVC then falls down and so on, each time with the emission of the overflow bit OVF.

Upon emission of the overflow bit OVF, there is a pulse of the sync signal CADCS which herein marks the beginning of a period of the converter clock signal CLKADC.

Figure 4:
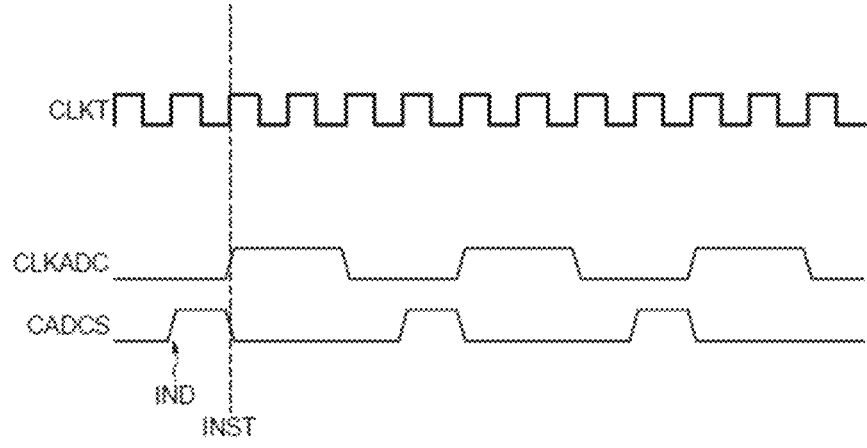
FIG. 4 illustrates a timing diagram for the first time point of each period of the converter clock signal.

One could see in FIG. 4, wherein the division factor DVF is considered for example equal to 4, that the sync signal CADCS is synchronous with the first clock signal CLKT.

Moreover, this sync signal CADCS indicates, for example on its falling edge, a first time point INST of each period of the converter clock signal CLKADC.

In this example, this first time point INST is the beginning of each period of the converter clock signal CLKADC.

Moreover, the rising edge of the sync signal CADCS, preceding the falling edge indicating the time point INST, supplies the indication IND that the rising edge of the converter clock signal CLKADC will occur at the next rising edge of the first clock signal CLKT.

Reference is now made again to FIG. 2 to continue the description of the processor MTR.

These include a second stage ET2 including a duplexer DPX3 whose input 0 is connected to the control input E2 receiving the external control signal SWCEN and whose input 1 is connected to the output Q of a flip-flop D referenced BSC2.

The input D of this flip-flop is connected to the output of the duplexer DPX3.

This flip-flop BSC2 is clocked by the first clock signal CLKT.

The output Q of the flip-flop BSC2 is connected to the enable input EN ("enable") of the timer CNT.

The duplexer DPX3 is controlled by the logic value of the output of an AND logic gate referenced PL3.

A first input of this logic gate PL3 is connected to the selection input E3 which receives the selection signal ADS.

The sync signal CADCS is delivered, after inversion, to the other input of the logic gate PL3.

The second stage ET2 also includes an AND logic gate with three inputs referenced PL4.

A first input of this gate PL4 receives, after inversion, the sync signal CADCS.

A second input of this gate PL4 receives the selection signal ADS and a third input of this door PL4 is fed back to the output Q of a flip-flop D referenced BSC3, which is also clocked by the first clock signal CLKT.

The output of the logic gate PL4 is connected to a first input of an OR logic gate referenced PL5.

The second input of this logic gate PL5 is connected to the input E4 so as to receive the signal SWCRST.

The output of the logic gate PL5 is connected to the input D of the flip-flop BSC3.

The output Q of the flip-flop BSC3 is also connected to the reset input RST of the timer CNT.

As of now, it should be noted that the logic value of the selection signal (bit) ADS defines the operating mode of the processor MTR.

Thus, for example, if the signal ADS has the logic value 1, while the processor MTR is in its first operating mode in which the timer CNT is in particular synchronous with the converter clock signal CLKADC.

However, if the sync signal ADS has the logic value 0 while the processor MTR is in its second operating mode in which it is configured to clock the timer CNT asynchronously with the converter clock signal CLKADC.

If the logic value of the selection signal ADS is equal to 1, then the value of the bit SYNC delivered by the output terminal BS3 is equal to 1 whereas if the logic value of the signal ADS is equal to 0, then the value of the bit SYNC is equal to 0.

The processor MTR also includes a third stage ET3 connected to the output of the timer CNT.

More specifically, this stage ET3 includes, in this embodiment, a first register RG1, a second register RG2 and a third register RG3.

For example, the first register RG1 includes the value of the timing period of the timer, for example the value 7 if the timer counts from 0 to 7.

The second register RG2 may contain another timing value of the timer CNT, for example the value 2, whereas the register RG3 may also contain another timing value of the timer, for example the value 5.

The third stage ET3 then includes three comparators CMP1, CMP2 and CMP3.

The first comparator CMP1 is configured to compare the timing value of the timer CNT with the value of the first register RG1 and deliver an event pulse when the timing value of the timer CNT reaches the value 7.

The second comparator CMP2 is configured to compare the timing value of the timer CNT with the timing value contained in the register RG2, herein the value 2, and deliver the event pulse each time the timer CNT delivers the timing value 2.

The third comparator CMP3 is configured to compare the timing value of the timer CNT with the timing value stored in the third register RG3 and output the event pulse each time the timing value reaches the value stored in the register RG3, in this case the value 5.

Controller MCM, for example software or hardware, is intended to control a multiplexer MX whose three inputs are connected to the three outputs of the comparators CMP1, CMP2 and CMP3 so as to select one amongst the three inputs to connect it to the output of the multiplexer MX.

The processor MTR also includes a fourth stage ET4.

This stage ET4 includes an AND logic gate with three inputs, referenced PL6.

A first input of the logic gate PL6 receives the selection signal ADS which is also delivered to the output terminal BS3 so as to become the bit SYNC.

A second input of the logic gate PL6 receives the inverted sync signal CADCS.

A third input of the logic gate PL6 is fed back to the output Q of a D-type flip-flop BSC4.

The output of the logic gate PL6 is connected to a first input of an OR logic gate, referenced PL7, whose second input is connected to the output of the multiplexer MX of the stage ET3.

The output of the logic gate PL7 is connected to the input D of the flip-flop BSC4 which is clocked by the first clock signal CLKT.

The fourth stage ET4 also includes an AND logic gate referenced PL8 whose first input is connected to the output Q of the flip-flop BSC4 and whose second input receives the selection signal ADS.

The output of the logic gate PL8 forms the output terminal BS1 and delivers the conversion control signal TRGS.

The fourth stage ET4 also includes an AND logic gate, referenced PL9, whose first input is connected to the output Q of the flip-flop BSC4 and whose second input receives the inverted selection signal ADS.

The output of this logic gate PL9 delivers the conversion control signal TRGA.

Depending on the logic value of the bit SYNC, the analog-to-digital converter ADC1 will select either the signal TRGS or the signal TRGA.

Figure 5:
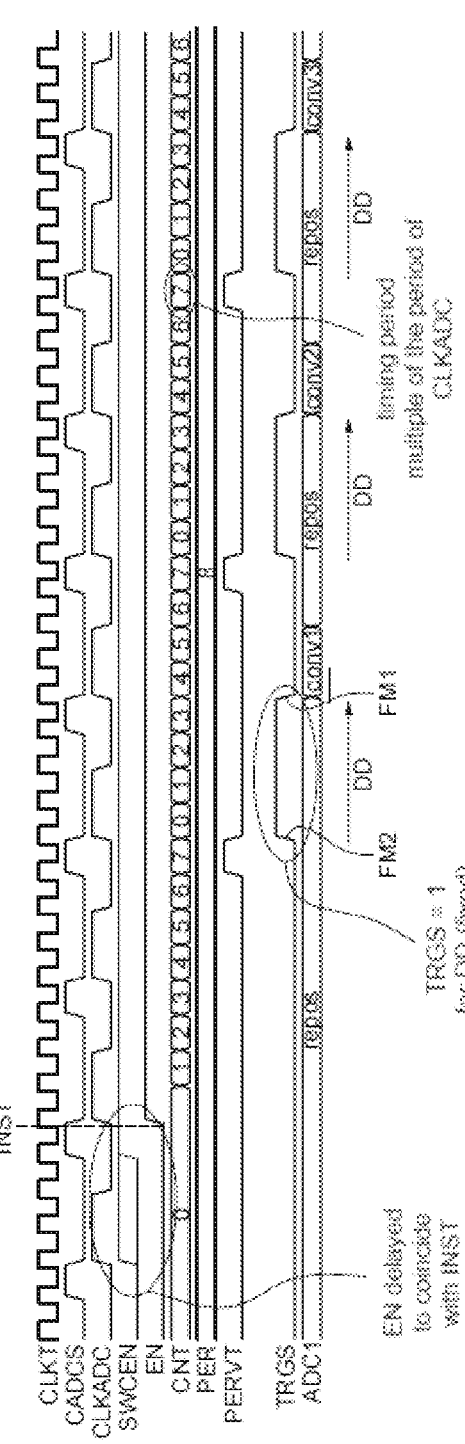
FIG. 5 illustrates a timing diagram of an operating mode of the device of FIG. 2.

Reference is now made more particularly to FIG. 5 which illustrates a time chart relating to the operating mode of the device of FIG. 2 when the selection signal ADS has a logic value 1 (timer synchronous with the converter clock signal CLKADC).

The upper part of the time chart of FIG. 5 illustrates the first clock signal CLKT.

The sync signal CADCS indicates, for example upon occurrence of a falling edge, the first time point INST, in this case herein the beginning of each period of the converter clock signal CLKADC.

In this diagram, the period of the clock signal CLKADC is four times as long as the period of the first clock signal CLKT.

Moreover, the activation signal EN of the timer CNT is delayed relative to the external control signal SWCEN, so as to coincide with the first time point INST.

In other words, the activation of the EN of the timer starts at the beginning of a period of the converter clock signal CLKADC.

In this example, the period PER of the timer is equal to 8, the timer counting from 0 to 7.

This timing period is a multiple of the period of the converter clock signal CLKADC.

In this exemplary implementation, it is assumed that the multiplexer MX has selected the output of the first comparator CMP1 connected to the first register RG1 which contains the value of the timing period minus 1, in this case the value 7.

Hence, each time the counter reaches the value 7, the third stage ET3 emits the event pulse PERVT which, when it falls down to 0, generates a rising edge FM2 of the periodic conversion control signal TRGS.

In this embodiment, upon completion of a period of the converter clock signal CLKADC, a falling edge FM1 of the signal TRGS occurs which triggers a conversion phase CONV1 of the converter ADC1.

This is repeated regularly at each event pulse PERVT so as to generate the conversion periods CONV2, CONV3 . . . .

One could notice that the duration DD between a rising edge FM2 and a falling edge of the signal TRGS is constant and fixed.

Hence, the conversion control signal TRGS of the converter is a periodic signal having a period multiple of the period of the converter clock signal, herein a period equal to the period of the converter clock signal, and a constant phase difference with the converter clock signal.

This phase difference corresponds to the duration DD and it also represents the latency.

In the example that has just been described, the conversion is triggered directly upon completion of the duration DD.

Alternatively, instead of directly triggering the conversion, it would be possible to provide for one or more flip-flop stage(s), crossed by the signal TRGS and clocked by the signal CLKADC, before triggering this conversion.

Thus, by adding 2 flip-flop stages, two periods of the signal CLKADC are added to the duration DD before triggering the conversion, which brings the fixed and constant latency to three periods of the signal CLKADC.

However, the phase difference between the signal TRGS and the signal CLKADC remains constant and equal to the duration DD, namely in this case a period of the signal CLKADC. One could see in more details hereinafter with reference to FIG. 9 that it would alternatively be possible to have a phase difference DD between the signal TRGS and the signal CLKADC, constant and equal to a period of the clock signal CLK (and therefore to a fraction of the period of the signal CLKADC) and a fixed latency equal to DD but possibly increased for example by several periods of the signal CLKADC.

Figure 6:
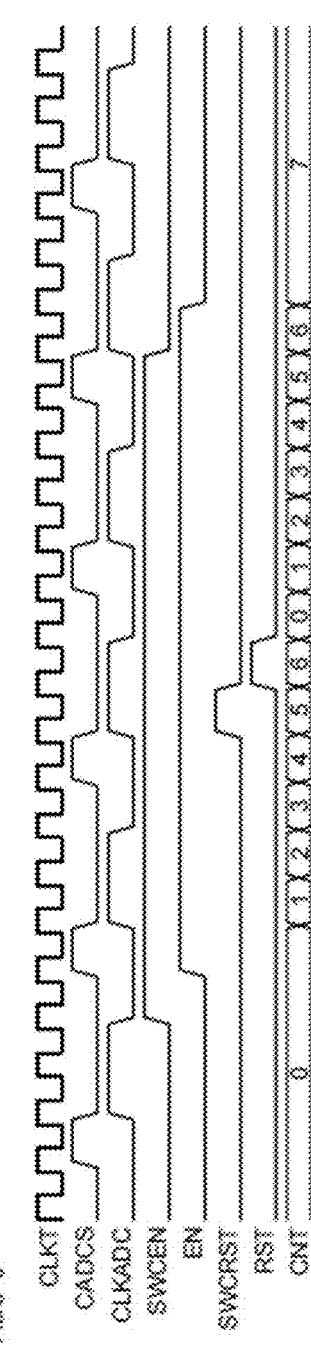
FIG. 6 illustrates a timing diagram of a second operating mode of the processor.
Figure 7:
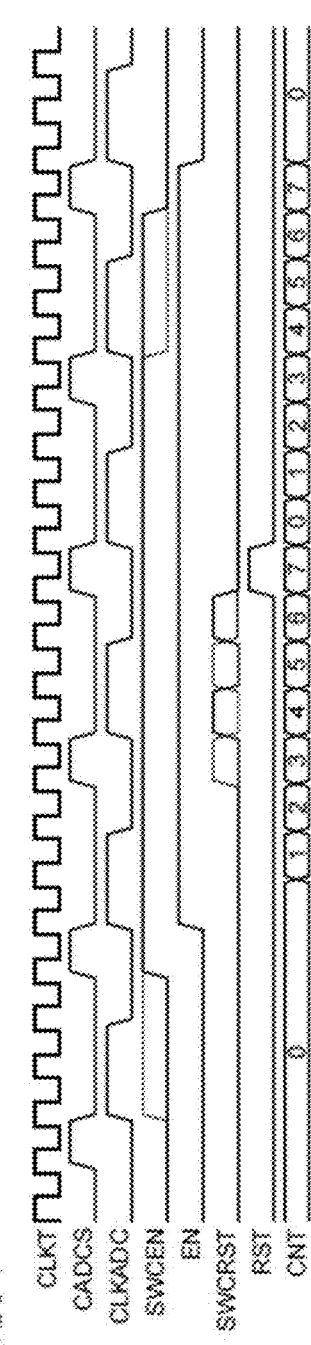
FIG. 7 illustrates a timing diagram of a first operating mode of the processor.

Reference is now made more particularly to FIGS. 6 and 7 to illustrate time charts relating respectively to the second operating mode (ADS=0) and to the first operating mode (ADS=1) of the processor MTR.

As illustrated in FIG. 7 and recalled hereinbefore, in the first operating mode of the processor (ADS=1), the timer CNT is clocked synchronously with the converter clock signal CLKADC.

Thus, the activation signal EN of the timer CNT is delayed related to the external control signal SWCEN so as to coincide with each period of the converter clock signal CLKADC.

Similarly, the effective reset RST of the timer is also delayed relative to the reset request external signal SWCRST, so as to also coincide with the beginning of a period of the converter clock signal CLKADC.

And, this is not the case in the second operating mode (ADS=0) wherein the timer is clocked asynchronously relative to the converter clock signal CLKADC.

Indeed, one could see that the activation effective signal EN of the timer follows the signal SWCEN (after a period of the signal CLKT) without being synchronized with the converter clock signal CLKADC.

The same applies for the reset effective signal RST which immediately follows the external signal SWCRST, without being also synchronized with the converter clock signal CLKADC.

Figure 8:
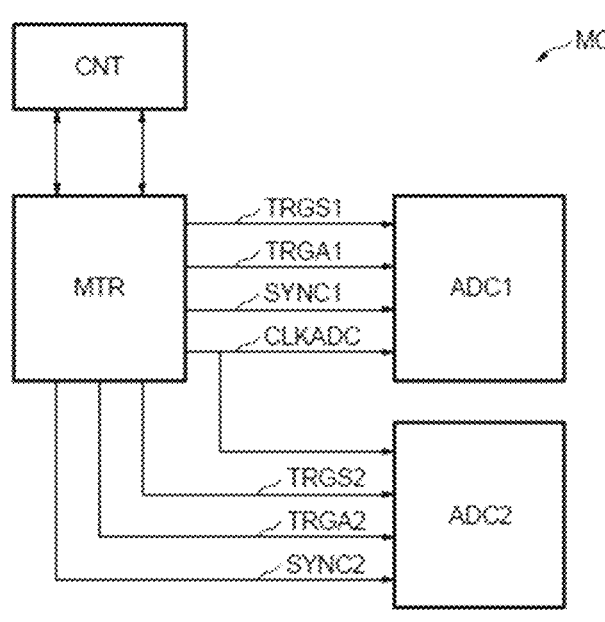
FIG. 8 illustrates a microcontroller including several analog-to-digital converters.

Reference is now made more particularly to FIG. 8 which illustrates a microcontroller MC including several analog-to-digital converters (herein only two converters ADC1 and ADC2 have been represented for simplicity).

The converter clock signal CLKADC clocks the two converters ADC1 and ADC2 which therefore receive the same clock signal.

Moreover, the multiplexer MX and the fourth stage ET4 are duplicated.

More specifically, a first multiplexer MX is connected to comparators CMP1-CMP3, followed by a stage ET4 which will deliver the signals TRGS1, TRGA1, SYNC1 to the first converter DC1.

And, a second multiplexer MX is also connected at the outputs of comparators CMP1-CMP3 followed by another stage ET4 which will deliver the signals TRGS2, TRGA2 and SYNC2 to the second converter ADC2.

In general, the signals SYNC1 and SYNC2 are identical because the two converters will operate either in the first operating mode or in the second operating mode.

And, the controller MCM will control the multiplexers MX in a first way to deliver the signals TRGA1 and TRGS1 whereas the controller will control the second multiplexer MX in a second way to deliver the signals TRGS2 and TRGA2.

Thus, for example, the first multiplexer MX could be controlled so as to select the first input connected to the first register RG1 whereas the second multiplexer could, for example, be controlled so as to select another input connected to either one of the registers RG2 and RG3.

It would also be possible to duplicate the timer CNT as well as the stages ET3 and ET4.

The invention is not limited to the embodiments and implementations that have just been described but encompasses all variants thereof.

Figure 9:
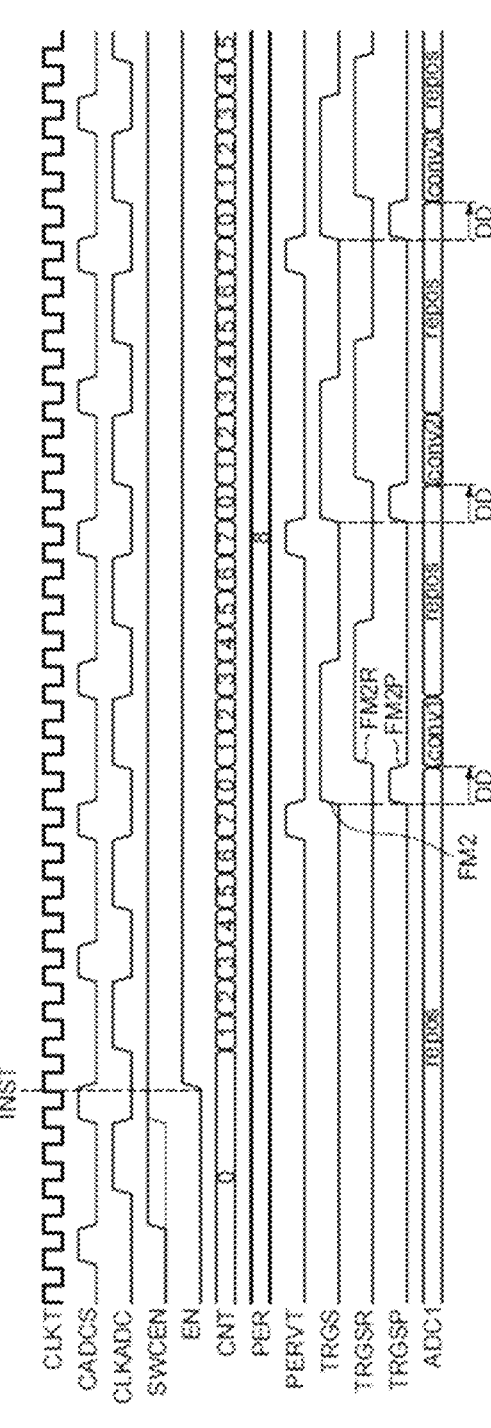
FIG. 9 illustrates a timing diagram with signals similar to those of FIG. 5 with, e.g., the sync signal advanced by one cycle of the first clock signal compared with FIG. 5.

Thus, as illustrated in the time chart of FIG. 9, wherein the signals similar to those of FIG. 5 bear the same references, the sync signal CADCS is advanced by one cycle of the first clock signal CLKT compared to the time chart of FIG. 5.

The sync signal CADCS indicates, for example upon occurrence of a falling edge, the first time point INST which is now located within each period of the converter clock signal CLKADC, and no longer, like in FIG. 5, at the beginning of each period of the converter clock signal CLKADC.

In this diagram of FIG. 9, the period of the clock signal CLKADC is four times as long as the period of the first clock signal CLKT.

Moreover, the activation signal EN of the time CNT is, herein again, delayed relative to the external control signal SWCEN, so as to coincide with the first time point INST.

Again, in this example, the period PER of the timer is equal to 8, the timer counting from 0 to 7.

In this exemplary implementation, it is also assumed that the multiplexer MX has selected the output of the first comparator CMP1 connected to the first register RG1 which contains the value of the timing period minus 1, in this case the value 7.

Hence, each time the counter reaches the value 7, the third stage ET3 emits the event pulse PERVT which, when it falls down to 0, generates a rising edge FM2 of the periodic conversion control signal TRGS.

In this embodiment, the signal TRGS is captured in a "flip flop" type latch generating a periodic signal TRGSR having a rising edge FM2R at the end of a cycle of the first clock signal CLKT.

This results in a generation of a pulse signal TRGSP whose falling edge FM2P will herein directly trigger a conversion phase CONV1.

This is repeated regularly at each event pulse PERVT so as to generate the conversion periods CONV2, CONV3 . . . .

Hence, the fixed and constant phase difference DD, between the signal TRGS and the signal CLKADC, is herein equal to a period of the clock signal CLKT and therefore to a fraction of the converter clock signal CLKADC.

Herein again, the latency is equal to DD.

Herein again, alternatively, instead of directly triggering the conversion, it is possible to provide for one or more flip-flop stage(s), crossed by the signal TRGS and clocked by the signal CLKADC, before triggering this conversion.

Thus, by adding 2 flip-flop stages, two periods of the signal CLKADC are added to the duration DD before triggering the conversion, which brings the fixed and constant latency to a period of the clock signal CLKT increased by two periods of the signal CLKADC.

However, the phase difference between the signal TRGS and the signal CLKADC remains constant and equal to the duration DD, namely herein a period of the signal CLKT.

What is claimed is:

1. An integrated circuit, comprising:
at least one first analog-to-digital converter, of the integrated circuit, configured to be clocked by a converter clock signal having a first frequency and a first period;

a clock input, of the integrated circuit, configured to receive a first clock signal having a second frequency multiple of the first frequency of the converter clock signal;

a timer, of the integrated circuit, configured to clock with a rhythm of the first clock signal and having a second period multiple of the first period of the converter clock signal; and a processor, of the integrated circuit, configured to control the at least one first analog-to-digital converter based on a timing signal delivered by the timer, wherein the processor has a first operating mode in which the processor is further configured to clock the timer synchronously with the converter clock signal, and to deliver, based on the timing signal, a first periodic conversion control signal to the at least one first analog-to-digital converter, the first periodic conversion control signal having a third period multiple of the first period of the converter clock signal and a first constant phase difference with the converter clock signal.

2. The integrated circuit according to claim 1, wherein:
the integrated circuit further comprises a control input configured to receive a conversion control external signal;
the processor is configured, in the first operating mode, in response to the conversion control external signal, to generate an edge of the periodic first conversion control signal each time the timer reaches a selected timing value; and
the at least one first analog-to-digital converter is configured to periodically start conversions after a fixed and constant first period after the edge of the periodic first conversion control signal.

3. The integrated circuit according to claim 2, wherein the processor is further configured to deliver the converter clock signal and a sync signal indicating a first time point of each period of the converter clock signal, wherein the first time point is identical for each period, and, in a presence of the conversion control external signal, to delay triggering of the timer until a next first time point.

4. The integrated circuit according to claim 2, wherein the processor is configured to select the selected timing value from among several predefined timing values.

5. The integrated circuit according to claim 2, wherein the timer is reset synchronously with the converter clock signal.

6. The integrated circuit according to claim 1, further comprising at least one second analog-to-digital converter that is clocked by the converter clock signal, and the processor is further configured, in the first operating mode, to deliver a second periodic conversion control signal having a fourth period multiple of the first period of the converter clock signal and a second constant phase difference with the converter clock signal.

7. The integrated circuit according to claim 1, wherein the processor has a second operating mode in which the processor is configured to clock the timer asynchronously with the converter clock signal.

8. The integrated circuit according to claim 7, further comprising a selection input configured to receive a selection signal, wherein the first and second operating modes of the processor are selectable by the selection signal.

9. A microcontroller, comprising:
at least one first analog-to-digital converter configured to be clocked by a converter clock signal having a first frequency and a first period;

a clock input configured to receive a first clock signal having a second frequency multiple of the first frequency of the converter clock signal;

a timer configured to clock with a rhythm of the first clock signal and having a second period multiple of the first period of the converter clock signal; and a processor configured to control the at least one first analog-to-digital converter based on a timing signal delivered by the timer, wherein the processor has a first operating mode in which the processor is further configured to clock the timer synchronously with the converter clock signal, and to deliver, based on the timing signal, a first periodic conversion control signal to the at least one first analog-to-digital converter, the first periodic conversion control signal having a third period multiple of the first period of the converter clock signal and a first constant phase difference with the converter clock signal.

10. The microcontroller according to claim 9, wherein:

the microcontroller further comprises a control input configured to receive a conversion control external signal;

the processor is configured, in the first operating mode, in response to the conversion control external signal, to generate an edge of the periodic first conversion control signal each time the timer reaches a selected timing value; and the at least one first analog-to-digital converter is configured to periodically start conversions after a fixed and constant first period after the edge of the periodic first conversion control signal.

11. The microcontroller according to claim 9, further comprising at least one second analog-to-digital converter that is clocked by the converter clock signal, and the processor is further configured, in the first operating mode, to deliver a second periodic conversion control signal having a fourth period multiple of the first period of the converter clock signal and a second constant phase difference with the converter clock signal.

12. The microcontroller according to claim 9, wherein the processor has a second operating mode in which the processor is configured to clock the timer asynchronously with the converter clock signal.

13. A method of operating an integrated circuit, the method comprising:

clocking, by a converter clock signal having a first frequency and a first period, at least one first analog-to-digital converter;

receiving, by a clock input, a first clock signal having a second frequency multiple of the first frequency of the converter clock signal;

clocking a timer with a rhythm of the first clock signal and with a second period multiple of the first period of the converter clock signal;

controlling, by a processor, the at least one first analog-to-digital converter based on a timing signal delivered by the timer;

operating, by the processor, in a first operating mode comprising:

clocking, by the processor, the timer synchronously with the converter clock signal; and delivering, by the processor, based on the timing signal, a first periodic conversion control signal to the at least one first analog-to-digital converter, the first periodic conversion control signal having a third period multiple of the first period of the converter clock signal and a first constant phase difference with the converter clock signal.

14. The method according to claim 13, wherein:

receiving, by a control input of the integrated circuit, a conversion control external signal;

generating, by the processor in the first operating mode, in response to the conversion control external signal, an edge of the periodic first conversion control signal each time the timer reaches a selected timing value; and periodically starting, by the at least one first analog-to-digital converter, conversions after a fixed and constant first period after the edge of the periodic first conversion control signal.

15. The method according to claim 14, further comprising, by the processor:

delivering the converter clock signal and a sync signal indicating a first time point of each period of the converter clock signal, the first time point being identical for each period; and delaying, in a presence of the conversion control external signal, triggering of the timer until a next first time point.

16. The method according to claim 14, further comprising, by the processor, selecting the selected timing value from among several predefined timing values.

17. The method according to claim 14, further comprising resetting the timer synchronously with the converter clock signal.

18. The method according to claim 13, further comprising:

clocking, by the converter clock signal, at least one second analog-to-digital converter; and delivering, by the processor, in the first operating mode, a second periodic conversion control signal having a fourth period multiple of the first period of the converter clock signal and a second constant phase difference with the converter clock signal.

19. The method according to claim 13, further comprising, by the processor, in a second operating mode, clocking the timer asynchronously with the converter clock signal.

20. The method according to claim 19, further comprising receiving, by a selection input, a selection signal, the first and second operating modes of the processor being selectable by the selection signal.

* * * * *